United States Patent
Kim (10) Patent No.: US 10,707,671 B2
(45) Date of Patent: Jul. 7, 2020

(54) METHOD OF DETECTING ELECTRICAL DISTURBANCE BY DC COMPONENT

(71) Applicant: LSIS CO., LTD., Gyeonggi-do (KR)

(72) Inventor: Ji-Ung Kim, Gyeonggi-do (KR)

(73) Assignee: LSIS CO., LTD., Anyang-si, Gyeonggi-Do (KR)

(*) Notice: Subject to any disclaimer, the term of this patent is extended or adjusted under 35 U.S.C. 154(b) by 398 days.

(21) Appl. No.: 15/613,306

(22) Filed: Jun. 5, 2017

(65) Prior Publication Data
US 2018/0191151 A1    Jul. 5, 2018

(30) Foreign Application Priority Data
Dec. 30, 2016  (KR) .......................... 10-2016-0183807

(51) Int. Cl.
| | | |
|---|---|---|
| *H02H 1/04* | (2006.01) | |
| *H02H 1/06* | (2006.01) | |
| *H02H 3/05* | (2006.01) | |
| *G01R 31/02* | (2006.01) | |

(52) U.S. Cl.
CPC ............. *H02H 1/04* (2013.01); *G01R 31/025* (2013.01); *H02H 1/063* (2013.01); *H02H 3/05* (2013.01)

(58) Field of Classification Search
CPC ....................................................... H02H 1/04
See application file for complete search history.

(56) References Cited

U.S. PATENT DOCUMENTS

| | | | | |
|---|---|---|---|---|
| 5,255,202 A | * | 10/1993 | Kido | G01R 19/25 702/190 |
| 5,453,903 A | * | 9/1995 | Chow | H02H 3/40 361/79 |
| 6,081,768 A | * | 6/2000 | Hu | G01R 19/04 361/78 |
| 2007/0086134 A1 | * | 4/2007 | Zweigle | G01R 19/2513 361/85 |
| 2008/0080114 A1 | * | 4/2008 | Schweitzer | H02H 3/05 361/62 |

(Continued)

FOREIGN PATENT DOCUMENTS

| | | |
|---|---|---|
| CN | 1623261 A | 6/2005 |
| CN | 201118196 Y | 9/2008 |

(Continued)

OTHER PUBLICATIONS

Korean Notice of Allowance dated Aug. 1, 2017 for corresponding KR application.

(Continued)

*Primary Examiner* — Raymond L Nimox
(74) *Attorney, Agent, or Firm* — K&L Gates LLP (57) ABSTRACT

The present disclosure relates a method of detecting an electrical disturbance by a DC component in a digital protective relay, which includes acquiring a sample value by sampling an input signal at a regular cycle, detecting the electrical disturbance based on a difference between a sampled first sample value and a second sample value after the first sample value, and when the electrical disturbance is detected, detecting the DC component based on a difference between the second sample value and a third sample value after the second sample value and a difference between the third sample value and a fourth sample value after the third sample value.

7 Claims, 4 Drawing Sheets

(56) References Cited

U.S. PATENT DOCUMENTS

| | | |
|---|---|---|
| 2009/0059449 A1 | 3/2009 | Rivers et al. |
| 2016/0233876 A1* | 8/2016 | Kim ........................ G01R 19/02 |
| 2017/0108541 A1* | 4/2017 | Oda ................. G01R 19/16547 |

FOREIGN PATENT DOCUMENTS

| | | |
|---|---|---|
| CN | 203275631 U | 11/2013 |
| CN | 103954906 A | 7/2014 |
| CN | 204333939 U | 5/2015 |
| CN | 204731310 U | 10/2015 |
| CN | 105870890 A | 8/2016 |
| JP | 2000217242 A | 8/2000 |
| JP | 2005006407 A | 1/2005 |
| JP | 2010042784 A | 2/2010 |
| KR | 10-0957565 B1 | 5/2010 |
| KR | 1020100101980 A | 9/2010 |
| KR | 10-2012-0087013 A | 8/2012 |
| KR | 10-1273144 B1 | 6/2013 |
| KR | 10-2016-0014647 A | 2/2016 |
| KR | 1020160097037 A | 8/2016 |

OTHER PUBLICATIONS

Chinese Office Action for related Chinese Application No. 201710448332.X; action dated Nov. 27, 2019; (7 pages).

* cited by examiner

METHOD OF DETECTING ELECTRICAL DISTURBANCE BY DC COMPONENT

CROSS-REFERENCE TO RELATED APPLICATIONS

This application claims the priority of Korean Patent Application No. 10-2016-0183807 filed on Dec. 30, 2016, in the Korean Intellectual Property Office, the disclosure of which is hereby incorporated by reference in its entirety.

BACKGROUND

1. Technical Field

The present disclosure relates to a method of detecting an electrical disturbance by a DC component, and more particularly to a method of detecting an electrical disturbance by a DC component, in which an electrical disturbance is detected based on a difference between two adjacent sample values, and a DC component included in the electrical disturbance is detected by using the two sample values after the electrical disturbance is detected.

2. Description of the Related Art

Digital protective relays are relay devices that break a circuit by outputting a control signal for breaking a circuit when various electric power accidents such as over-currents, short-circuit accidents, ground faults occur in electric power lines.

A digital protective relay equipped with a microprocessor may implement a high performance relay algorithm that has not been implemented in a conventional inductive or static protection relay. Furthermore, the digital protective relay has various additional functions such as a self-diagnosis function, an accident recording function, etc., and thus accidents may be easily analyzed with excellent reliability.

In particular, a self-power relay is recently used as one of the digital protective relays. The self-power relay is a relay that performs a relay operation by receiving electric power through an input signal input from an electric power line and simultaneously analyzing the input signal.

The self-power relay samples the input signal input from the electric power line, and performs a discrete time Fourier transform (DFT) on sample values to remove effects of electrical disturbances or harmonic components.

However, since an operation reference value initially set to the self-power relay does not match the amplitude of an initially input signal, an initial sample value of a self-power relay with respect to the input signal unavoidably includes an electrical disturbance by a DC component.

The conventional self-power relay performs the DFT on a sample value of a minimum ½ cycle to perform a relay operation based on a pure AC component by removing the above-described electrical disturbance by a DC component. When the DFT value converges to a certain value, the self-power relay performs a relay algorithm based on a sample value obtained thereafter.

Accordingly, an actual relay operation of the conventional self-power relay has a delay time of about one cycle of an input signal and thus an instantaneous relay operation may be restricted.

Consequently, when the conventional self-power relay is used, due to restriction in the relay operation time, initial relay performance may be given up or a malfunction that may be generated by a DC component may be endured.

SUMMARY

It is an object of the present disclosure to provide a method of detecting an electrical disturbance by a DC component, which may prevent malfunction of a digital protection relay that may be generated by a DC component by detecting the DC component by using sample values adjacent in time.

It is another object of the present disclosure to provide a method of detecting an electrical disturbance by a DC component, which enables a self-power relay to perform an instantaneous relay operation by detecting a total four sample values only, that is, two sample values for detecting an electrical disturbance and two sample values after the electrical disturbance is detected.

It is another object of the present disclosure to provide a method of detecting an electrical disturbance by a DC component, which may detect electrical disturbances of various patterns, not a fixed pattern, by detecting the electrical disturbances by comparing a difference between adjacent sample values with a maximum value set based on a sampling cycle of an input signal and the amount of a breaking current of a digital protective relay.

It is another object of the present disclosure to provide a method of detecting an electrical disturbance by a DC component, which may improve stability of a relay operation by controlling a digital protective relay not to perform a breaking operation when an electrical disturbance is detected.

Objects of the present disclosure are not limited to the above-described objects and other objects and advantages can be appreciated by those skilled in the art from the following descriptions. Further, it will be easily appreciated that the objects and advantages of the present disclosure can be practiced by means recited in the appended claims and a combination thereof.

In accordance with one aspect of the present disclosure, a method of detecting an electrical disturbance by a DC component in a digital protective relay includes acquiring a sample value by sampling an input signal at a regular cycle, detecting the electrical disturbance based on a difference between a sampled first sample value and a second sample value after the first sample value, and when the electrical disturbance is detected, detecting the DC component based on a difference between the second sample value and a third sample value after the second sample value and a difference between the third sample value and a fourth sample value after the third sample value.

DETAILED DESCRIPTION

The above objects, features and advantages will become apparent from the detailed description with reference to the accompanying drawings. Embodiments are described in sufficient detail to enable those skilled in the art in the art to easily practice the technical idea of the present disclosure. Detailed descriptions of well-known functions or configurations may be omitted in order not to unnecessarily obscure the gist of the present disclosure. Hereinafter, embodiments of the present disclosure will be described in detail with reference to the accompanying drawings. Throughout the drawings, like reference numerals refer to like elements.

A method of detecting an electrical disturbance by a direct current (DC) component according to an embodiment of the present inventive concept relates to a method of detecting an electrical disturbance by a DC component in a digital protective relay 100. Accordingly, the method of detecting an electrical disturbance by a DC component according to the present embodiment may be performed by a micro controller unit (MCU) in the digital protective relay 100.

The digital protective relay 100 is a relay device that controls the operation of a relay by analyzing a voltage, current, resistance, and temperature of a relay object. Furthermore, the digital protective relay 100 provides a user with a visual or auditory output such as lighting of a lamp, display of characters or numbers, voice alarm, etc. according to an analyzed state of the relay object.

In an embodiment, the digital protective relay 100 according to the present disclosure may include a self-power relay. The self-power relay is a relay that performs a relay operation by receiving electric power through an input signal input from an electric power line and simultaneously analyzing the input signal.

Figure 1:
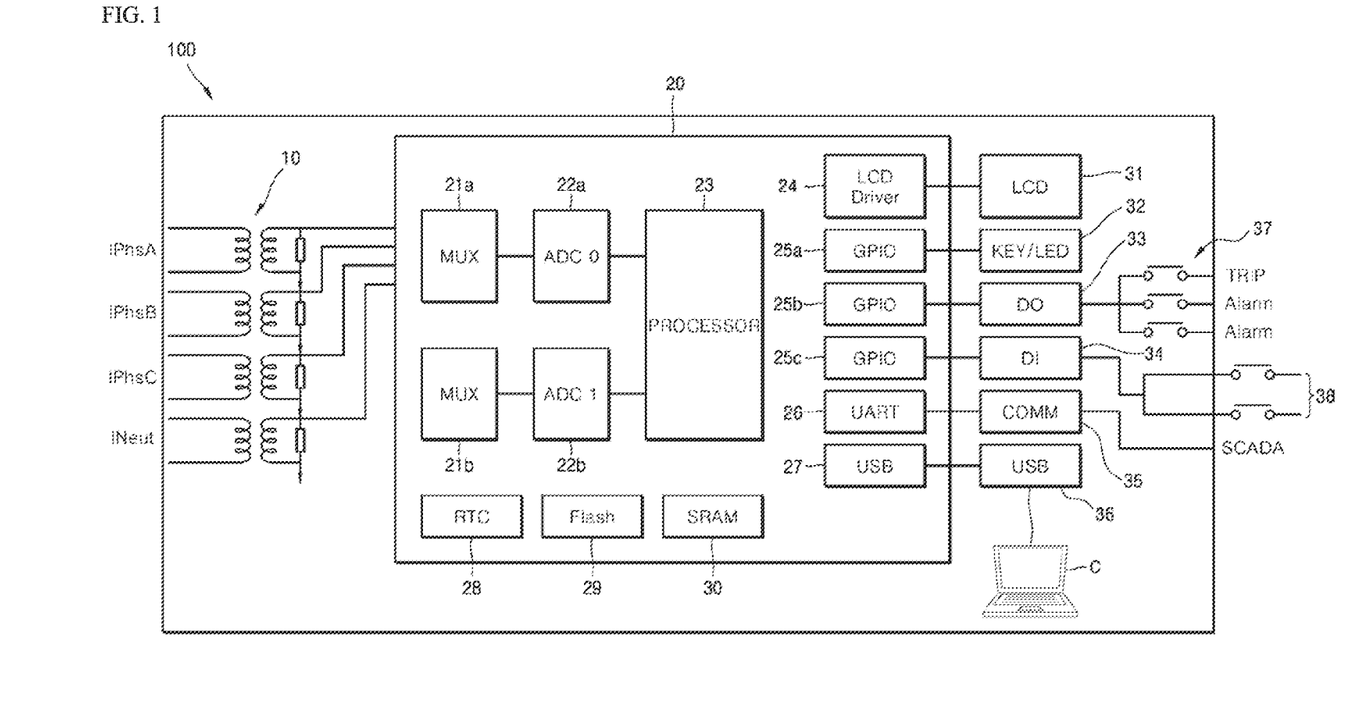
FIG. 1 illustrates a digital protective relay according to an embodiment of the present inventive concept.

FIG. 1 illustrates the digital protective relay 100 according to an embodiment of the present inventive concept. Hereinafter, the digital protective relay 100 that performs the method of detecting an electrical disturbance by a DC component according to the present disclosure is described in detail with reference to FIG. 1.

Referring to FIG. 1, the digital protective relay 100 according to the present embodiment may include a transformer 10, a controller 20, and input/output units 31 to 38.

In FIG. 1, "IPhsA", "IPhsB", and "IPhsC" may denote current input signals of an A-phase, a B-phase, and a C-phase in a 4-phase AC circuit, and INeut may denote a current input signal of an N-phase (neutral pole) in the 4-phase AC circuit. The current input signals input through the IPhsA, IPhsB, IPhsC, and INeut may be converted by the transformer 10 to voltage signals having a small amplitude which can be processed by a processor 23.

A MUX may include a first multiplexer 21a for selectively supplying any one of the above-described current input signals of an A-phase, a B-phase, a C-phase, and an N-phase to a first analog-to-digital converter ADC 0. Furthermore, the MUX may include a second multiplexer 21b for selectively supplying any one of voltage input signals (not shown) of an A-phase, a B-phase, a C-phase, and an N-phase to a second analog-to-digital converter ADC 1.

The controller 20 may include the first and second analog-to-digital converters ADC 0 and ADC 1 and the processor 23. The first and second analog-to-digital converters ADC 0 and ADC 1 may sample and convert analog signals input through the multiplexers 21a and 21b to digital signals.

In an embodiment, while the first analog-to-digital converter ADC 0 may sample and convert current input signals of the relay object according to their phases to digital signals, the second analog-to-digital converter ADC 1 may sample and convert voltage input signals of the relay object according to their phases to digital signals.

The processor 23 may include a microprocessor, and may analyze digital signals sampled by the first and second analog-to-digital converters ADC 0 and ADC 1. In detail, the processor 23 may detect a harmonic component included in the input signal by performing a discrete time Fourier transform (DFT) on the sampled digital signals for a certain time. The methods of analyzing a digital signal and detecting a harmonic component by the processor 23 are described later.

A liquid crystal display (LCD) driver 24 may be a driving circuit for driving an LCD display. Furthermore, a general-purpose input/output (GPIO) may include a first input/output interface 25a through which a key switch input is received and an output signal of a light-emitting diode is output, a second input/output interface 25b through which a trip control signal and an alarm signal of a circuit breaker are output, and a third input/output interface 25c through which a digital input according to selective manipulation of an input switch is received.

A universal asynchronous receiver/transmitter (UART) 26 may be a universal asynchronous receiver transmitter, and a universal serial bus (USB) 27 may be a universal serial bus interface. Furthermore, a real-time clock (RTC) 28 may be a real-time clock that provides real-time clock information, and a Flash 29 may be a flash memory for storing a program to process an input signal. Furthermore, a static random access memory (SRAM) 30 may be SRAM for storing data while power is supplied to the digital protective relay 100.

A LCD 31 may be an LCD display as a display device. A KEY/LED 32 may be a key switch and a light-emitting diode, as input/output devices. Furthermore, a DO 33 and a DI 34 may be a digital output port and a digital input port, respectively. The DO 33 that is a digital output port may be connected to an output relay contact 37, and the DI 34 that is a digital input port may be connected to an input switch 38.

A COMM 35 may be an external process control system, for example, a supervisory control and data acquisition (SCADA) system. A USB 36 may be a USB port for connecting a terminal capable of data input/output, such as an external computer C.

The method of detecting an electrical disturbance by a DC component according to the present disclosure may be performed by the analog-to-digital converters 22a and 22b (hereinafter, referred to as the analog-to-digital converter 22) and the processor 23 in the digital protective relay 100.

In detail, according to an embodiment of the present inventive concept, the analog-to-digital converter 22 may acquire a sample value by sampling the input signal at a regular cycle.

In the present disclosure, the input signal may be input from the relay object. The digital protective relay 100 may recognize a state of the relay object based on a signal (current, voltage, resistance, temperature, etc.) input from the relay object, and control an operation of a breaker based on the state of the relay object.

For example, the relay object may be an electric circuit included in a power system, and in the SCADA system, the relay object may include various circuits for controlling individual processes.

The term "sampling" may signify extracting analog data as digital data, and may signify expressing the amplitude of an input signal at a specific time point by a sample value that is digital data.

Furthermore, a regular cycle for acquiring a sample value may signify a sampling cycle of the analog-to-digital converter 22, and may signify a data acquisition cycle for acquiring the amplitude of an analog input signal according to time.

The analog-to-digital converter 22 according to the present disclosure may sample the input signal thirty-two (32) times for each cycle. For example, when the input signal is an AC voltage signal of 60 Hz, one cycle of the input signal is about 16.67 ms. Accordingly, the sampling cycle of the analog-to-digital converter 22 performing thirty-two times of sampling for each cycle of the input signal may be about 0.521 ms.

The sampling frequency per cycle of the analog-to-digital converter 22 is merely an example according to an embodiment, and thus, the present disclosure is not limited thereto and the above sampling frequency may vary according to performance of the analog-to-digital converter 22.

The processor 23 according to an embodiment of the present inventive concept may detect electrical disturbances based on a difference between a first sample value that is sampled and a second sample value after the first sample value is sampled. The electrical disturbance may denote addition of an unexpected signal to the input signal due to external factors, and a method of detecting electrical disturbances is described in detail with reference to FIG. 2.

Figure 2:
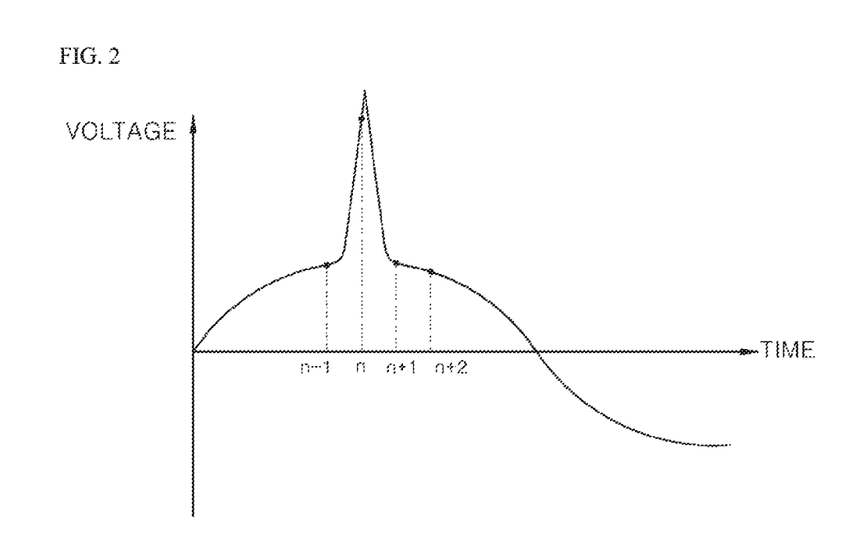
FIG. 2 is a graph showing that an electrical disturbance occurs in an AC input signal.

FIG. 2 is a graph showing that an electrical disturbance occurs in an AC input signal. Referring to FIG. 2, the analog-to-digital converter 22 may sample an input signal (AC voltage signal) according to a sampling cycle.

In detail, the analog-to-digital converter 22 may convert the amplitude of an input signal to digital data according to a sampling cycle including time points "n−1", "n", "n+1", and "n+2", and may converted digital data to the processor 23.

The processor 23 may calculate a difference between the first sample value and the second sample value sampled by the analog-to-digital converter 22. In detail, in FIG. 2, the processor 23 may calculate |second sample value−first sample value| that is a difference between the second sample value sampled at the time point n and the first sample value sampled at the time point n−1.

The processor 23 may detect electrical disturbances by comparing the calculated |second sample value−first sample value| with a preset maximum value. The preset maximum value may be determined based on the sampling cycle of the input signal and the amount of a breaking current of the digital protective relay 100.

In detail, a range of current measureable by the digital protective relay 100 may correspond to the amplitude of an input voltage signal. For example, when the measureable current range is 0 A to 100 A, and the maximum amplitude of an input voltage signal is 1.5 V, a voltage corresponding to 1 A is 0.015 V. When the amount of a breaking current that is a reference for a breaking operation of the digital protective relay 100 is 80 A, the amplitude of a breaking voltage that is a reference for a breaking operation of the digital protective relay 100 is 1.2 V.

The input voltage signal may be 60 Hz and may be sampled thirty-two (32) times per cycle. Accordingly, when the input voltage signal increases from 0 V to 1.2 V during eight (8) times of sampling corresponding to a quarter (¼) cycle, a difference between 0 V and a first sample value, which is the largest difference between adjacent sample values, may be set to be the preset maximum value.

The above-described measurable current range, the amplitude of an input voltage signal, the frequency of an input voltage signal, and the cycle for sampling an input voltage signal are according to an embodiment to explain the preset maximum value of the present disclosure, they may be variously modified according to the performance of the digital protective relay 100 and user's settings.

The processor 23 according to an embodiment of the present inventive concept may determine that an electrical disturbance has occurred when the difference between the first sample value and the second sample value exceeds the preset maximum value. The preset maximum value may be determined by the above-described method and may be, for example, 0.7 V.

Referring back to FIG. 2, the preset maximum value for detecting an electrical disturbance may be 0.7 V. The first sample value and the second sample value sampled at the time points n−1 and n may be 1.3 V and 3.2 V, respectively. The processor 23 may calculate the difference between the first sample value and the second sample value.

In detail, the processor 23 may calculate the difference between the sample values at the time points n and n−1 to be 1.9 V that is |3.2 V−1.3 V|. The processor 23 may determine that an electrical disturbance has occurred when the calculated difference between the sample values exceeds 0.7 V that is the preset maximum value.

In the above-described embodiment, since the difference (1.9 V) between the sample values at the time points n and n−1 exceeds 0.7 V, the processor 23 may determine that an electrical disturbance has occurred at the time point n.

In other words, when a difference between adjacent sample values first exceeds the preset maximum value (at the time point n), the processor 23 may recognize that an electrical disturbance occurs at the time point. The processor 23 may store in the SRAM 30 of FIG. 1 time before and after a certain time point and sample values, based on the time point when the electrical disturbance is detected electrical disturbance.

As described above, according to the present disclosure, since an electrical disturbance is detected by comparing the difference between adjacent sample values with the maximum value set based on the amount of the breaking current of the digital protective relay 100 and the sampling cycle of an input signal, electrical disturbances of various patterns, not a fixed pattern, may be detected.

According to another embodiment of the present inventive concept, the processor 23 may detect an electrical disturbance by performing the DFT on digital data sampled and input by the analog-to-digital converter 22 for a certain time.

In detail, when the DFT is performed on a fundamental wave (AC input signal), a conversion value may converges on a normal convergence value as a frequency increases. If the fundamental wave includes a harmonic component, the value on which the conversion value converges may be less than the normal convergence value. Furthermore, when the fundamental wave includes an electrical disturbance, the value on which the conversion value converges may be further less than that in the case including the harmonic component.

The processor 23 may determine that an electrical disturbance has occurred in the input signal when the value on which a discrete Fourier conversion value converges is out of a preset range. The preset range may be set by a user considering the ratio of the harmonic component included in the AC input signal.

For example, when the user sets the ratio of a harmonic component to be 20% with respect to the fundamental wave, a value on which a discrete Fourier conversion value of the input signal including the harmonic component converges may be less than a normal convergence value with respect to the fundamental wave, by the preset value.

The user may set a range from the normal convergence value with respect to the fundamental wave to a convergence value with respect to the input signal including the harmonic component of 20%, to be the preset range. The processor 23 may determine that a specific input signal includes an electrical disturbance unless a discrete Fourier conversion value of the specific input signal converges in the preset range.

When an electrical disturbance is detected, the processor 23 according to an embodiment of the present inventive concept may detect a DC component based on a difference between the second sample value and a third sample value after the second sample value and the third sample value and a fourth sample value after the third sample value.

In detail, the processor 23 may detect a DC component by comparing the difference between the second sample value and the third sample value and the difference between the third sample value and the fourth sample value, with a preset minimum value. The preset minimum value is a reference value for distinguishing the AC component and the DC component, which may be freely set by the user and may be, for example, 0.05 V.

Referring back to FIG. 2, as described above, the processor 23 may determine that an electrical disturbance has occurred at the time point n. The third sample value at the time point n+1 after the second sample value at the time point n may be 1.35 V, and the fourth sample value at the time point n+2 after the third sample value at the time point n+1 may be 1.15 V. The processor 23 may calculate the difference between the second sample value and the third sample value and the difference between the third sample value and the fourth sample value.

In detail, the processor 23 may calculate, at the time point n+1, a difference between the sample values at the time point n+1 and the time point n to be 1.85 V that is |1.35 V−3.2 V|. Furthermore, the processor 23 may calculated, at the time point n+2, a difference between the sample values at the time point n+2 and the time point n+1 to be 0.2 V that is |1.15 V−1.35 V|.

The processor 23 may detect a DC component by comparing the calculate |third sample value−second sample value| and |fourth sample value−third sample value| with the preset minimum value. In the above-described example, 1.85 V that is the difference between the sample values at the time point n+1 and the time point n and 0.2 V that is the difference between the sample values at the time point n+2 and the time point n+1 may be compared with 0.05 V that is the preset minimum value.

The processor 23 may determine that the detected electrical disturbance has occurred due to the DC component when the difference between the second sample value and the third sample value is less than the preset minimum value and the difference between the third sample value and the fourth sample value is also less than the preset minimum value.

In detail, in the above-described example, both the difference (1.85 V) between the sample values at the time point n+1 and the time point n and the difference (0.2 V) between the sample values at the time point n+2 and the time point n+1 are greater than or equal to 0.05 V that is the preset minimum value. Accordingly, the processor 23 may determine that the detected electrical disturbance is not caused by the DC component.

Figure 3:
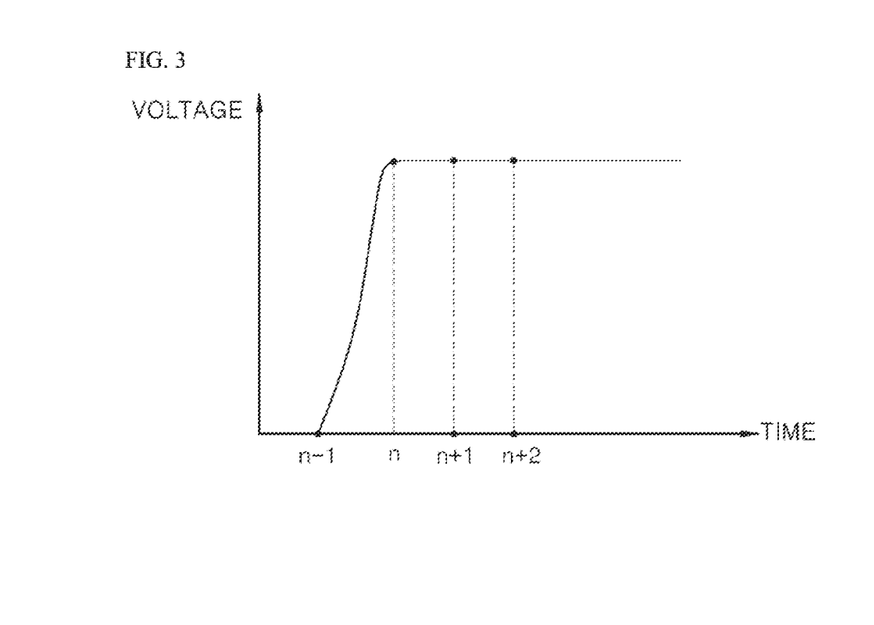
FIG. 3 is a graph showing that an electrical disturbance by a DC component occurs.

FIG. 3 is a graph showing that an electrical disturbance by a DC component occurs. Referring to FIG. 3, the analog-to-digital converter 22 may sample the input signal according to a sampling cycle.

In detail, the analog-to-digital converter 22 may convert the amplitude of the input signal to digital data according to a sampling cycle including the time points n−1, n, n+1, and n+2, and transmit converted digital data to the processor 23.

The processor 23 may calculate |second sample value−first sample value| that is a difference between the second sample value sampled at the time point n and the first sample value sampled at the time point n−1, and may detect an electrical disturbance by comparing the difference with a preset maximum value.

In FIG. 3, the preset maximum value for detecting electrical disturbances may be 0.7 V that is the same as the value described in FIG. 2. The first sample value and second sample value sampled at the time points n−1 and n of FIG. 3 may be 0 V and 3.2 V, respectively. The processor 23 may calculate, at the time point n, the difference between the sample values at the time points n and n−1 to be 3.2 V that is |3.2 V−0 V|.

The processor 23 may determine that an electrical disturbance has occurred at the time point n because the difference (3.2 V) between the sample values at the time points n and n−1 exceeds 0.7 V. As described above, the processor 23 may store in the SRAM 30 before and after a certain time point and sample values based on the time point when the electrical disturbance is detected.

When the electrical disturbance is detected, the processor 23 may detect a DC component by comparing the difference between the second sample value and the third sample value and the difference between the third sample value and the fourth sample value with a preset minimum value. The preset minimum value may be 0.05 V that is the same as the value described in FIG. 2.

The third sample value at the time point n+1 may be 3.22 V, and the fourth sample value at the time point n+2 may be 3.21 V. Accordingly, the processor 23 may calculate, at the time point n+1, the difference between the sample values at the time point n+1 and the time point n to be 0.02 V that is |3.22 V−3.2 V|. Furthermore, the processor 23 may calculate, at the time point n+2, the difference between the sample values at the time point n+2 and the time point n+1 to be 0.01 V that is |3.21 V−3.22 V|.

The processor 23 may compare 0.02 V that is the difference between the sample values at the time point n+1 and the time point n and 0.01 V that is the difference between the sample values at the time point n+2 and the time point n+1 with 0.05 V that is the preset minimum value. As a result of the comparison, since 0.02 V that is the difference between the sample values at the time point n+1 and the time point n is less than 0.05 V and 0.01 V that is the difference between the sample values at the time point n+2 and the time point n+1 is also less than 0.05 V, the processor 23 may determine that the detected electrical disturbance has occurred due to the DC component.

When the electrical disturbance is detected by the above-described method, the processor 23 according to an embodiment of the present inventive concept may replace at least one of the first sample value, the second sample value, the third sample value, and the fourth sample value with a sample value prior to a preset cycle.

The processor 23 of the present inventive concept may recognize whether an electrical disturbance occurred at a time point when the second sample value is acquired, and may recognize whether the electrical disturbance occurred due to the DC component, at a time point when the fourth sample value is acquired.

The SRAM 30 of FIG. 1 may store all sample values sampled after power is applied to the digital protective relay 100. Accordingly, the processor 23 may replace at least one of the first to fourth sample values that are sample values before and after the occurrence of the electrical disturbance, with a sample value stored in the SRAM 30.

In detail, in the case of the AC input signal of FIG. 2, the processor 23 may replace each of the first to fourth sample values with a sample value with respect to the AC input signal prior to the preset cycle. It is assumed that the AC input signal prior to the preset cycle does not include an electrical disturbance.

In the case of the AC input signal of FIG. 3, the processor 23 may replace each of the first to fourth sample values with a sample value, that is, 0 V, with respect to the input signal prior to the preset cycle. Likewise, it is assumed that the input signal prior to the preset cycle does not include an electrical disturbance.

Furthermore, when the electrical disturbance is detected by the above-described method, the processor 23 according to an embodiment of the present inventive concept may control the digital protective relay 100 not to perform a breaking operation.

In general, when the amount of current detected through the input signal relay input from an object is greater than or equal to a certain amount, the processor 23 may apply a breaking signal to a breaker to cut off a circuit of the relay object.

However, since the electrical disturbance is a signal due to external factor, the electrical disturbance may not be related to the state of the relay object. Accordingly, the processor 23 blocks a cut-off signal applied to the breaker when the electrical disturbance is detected, and thus controls the digital protective relay 100 not to perform a breaking operation.

As described above, according to the present inventive concept, when the electrical disturbance is detected, the digital protective relay 100 is controlled not to perform the breaking operation and thus stability of a relay operation may be improved.

Figure 4:
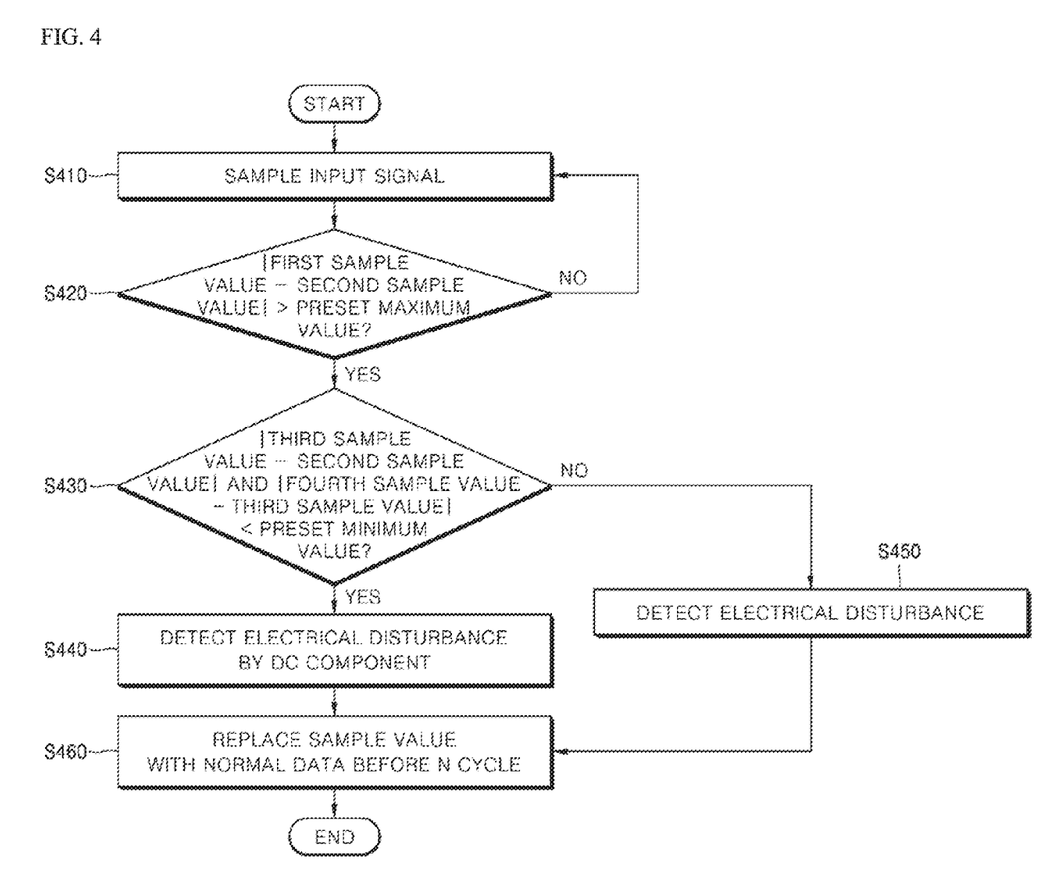
FIG. 4 is a flowchart for explaining a method of detecting an electrical disturbance by a DC component, according to an embodiment of the present inventive concept.

FIG. 4 is a flowchart for explaining a method of detecting an electrical disturbance by a DC component, according to an embodiment of the present inventive concept. The method of detecting an electrical disturbance by a DC component according to an embodiment of the present inventive concept is described in detail.

The method of detecting an electrical disturbance by a DC component according to the present inventive concept may be performed by the analog-to-digital converter 22 and the processor 23 of FIG. 1. The analog-to-digital converter 22 may acquire a sample value by sampling an input signal at a regular cycle (S410).

The processor 23 may compare a difference between a first sample value and a second sample value after the first sample value, with a preset maximum value (S420). The difference between the first sample value and the second sample value is less than a preset maximum value, the above-described operation 410 is repeated.

As a result of the comparison, if the difference between the first sample value and the second sample value exceeds the preset maximum value, the processor 23 may compare a difference between the second sample value and a third sample value after the second sample value and a difference between the third sample value and a fourth sample value after the third sample value, with the preset minimum value (S430).

As a result of the comparison, if both the difference between the second sample value and the third sample value and the difference between the third sample value and the fourth sample value are less than the preset minimum value, the processor 23 may detect that an electrical disturbance by a DC component occurs in the input signal (S440).

In contrast, when the difference between the second sample value and the third sample value is greater than or equal to the preset minimum value, or the difference between the third sample value and the fourth sample value is greater than or equal to the preset minimum value, the processor 23 may detect that an electrical disturbance that is not caused by a DC component has occurred in the input signal (S450).

In contrast, when the electrical disturbance is detected in the operations S440 and S450, the processor 23 may replace at least one of sample values before and after the time point when the electrical disturbance is detected, with a sample value prior to a preset cycle (N cycle) (S460).

As described above, according to the present inventive concept, since a DC component is detected by using sample values adjacent in time, malfunction of the digital protective relay 100 that may be generated by a DC component may be prevented.

Furthermore, according to the present inventive concept, since a DC component is detected by using two samples for detecting an electrical disturbance and two sample values after a time point when the electrical disturbance is detected, that is, a total of four (4) sample values only, a self-power relay may perform an instantaneous relay operation.

Furthermore, according to the present inventive concept, since an electrical disturbance is detected by comparing a difference between the adjacent sample values with a maximum value set based on the amount of a breaking current of a digital protective relay and a sampling cycle of an input signal, electrical disturbances of various patterns, not a fixed pattern, may be detected.

Furthermore, according to the present inventive concept, since a digital protective relay is controlled not to perform a breaking operation when an electrical disturbance is detected, stability of a relay operation may be improved.

The present disclosure described above may be variously substituted, altered, and modified by those skilled in the art to which the present inventive concept pertains without departing from the scope and sprit of the present disclosure. Therefore, the present disclosure is not limited to the above-mentioned exemplary embodiments and the accompanying drawings.

What is claimed is:
1. A method of detecting an electrical disturbance by a DC component in a digital protective relay, the method comprising
    acquiring a sample value by sampling an input signal at a regular cycle;
    detecting the electrical disturbance based on a difference between a sampled first sample value and a second sample value after the first sample value;
    detecting the DC component based on a difference between the second sample value and a third sample value after the second sample value and a difference between the third sample value and a fourth sample value after the third sample value, when the electrical disturbance is detected, and controlling the digital protective relay not to perform a breaking operation, when the electrical disturbance is detected.

2. The method of claim 1, wherein the detecting of the electrical disturbance comprises detecting the electrical disturbance by comparing the difference between the first sample value and the second sample value with a preset maximum value.

3. The method of claim 2, wherein the detecting the electrical disturbance by comparing the difference between the first sample value and the second sample value with the preset maximum value comprises determining that the electrical disturbance occurs when the difference between the first sample value and the second sample value exceeds the preset maximum value.

4. The method of claim 2, wherein the preset maximum value is determined based on an amount of a breaking current of the digital protective relay and a cycle of sampling the input signal.

5. The method of claim 1, wherein the detecting of the DC component comprises detecting the DC component by comparing the difference between the second sample value and the third sample value and the difference between the third sample value and the fourth sample value with a preset minimum value.

6. The method of claim 5, wherein the detecting of the DC component by comparing the difference between the second sample value and the third sample value and the difference between the third sample value and the fourth sample value with the preset minimum value comprises determining that the electrical disturbance occurs due to the DC component when the difference between the second sample value and the third sample value is less than the preset minimum value and the difference between the third sample value and the fourth sample value is less than the preset minimum value.

7. The method of claim 1, further comprising replacing at least one of the first sample value, the second sample value, the third sample value, and the fourth sample value with a sample value prior to a preset cycle, when the electrical disturbance is detected.

* * * * *